United States Patent
Ikezaki

(10) Patent No.: US 7,187,791 B2
(45) Date of Patent: Mar. 6, 2007

(54) COIL SENSITIVITY MAP GENERATING METHOD, PARALLEL IMAGING METHOD, AND MRI APPARATUS

(75) Inventor: Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 869 days.

(21) Appl. No.: 10/454,356

(22) Filed: Jun. 4, 2003

(65) Prior Publication Data

US 2003/0228043 A1    Dec. 11, 2003

(30) Foreign Application Priority Data

Jun. 7, 2002    (JP) .............................. 2002-166994

(51) Int. Cl.
    *G06K 9/00*    (2006.01)
(52) U.S. Cl. .................. 382/128; 382/131; 324/306; 324/307; 324/309
(58) Field of Classification Search ................ 382/128, 382/131; 324/306, 307, 309, 312
    See application file for complete search history.

(56) References Cited

U.S. PATENT DOCUMENTS 5,659,629 A    8/1997    Cline 6,215,911 B1    4/2001    Goertler et al.
6,289,232 B1    9/2001    Jakob et al.
6,326,786 B1    12/2001   Pruessmann et al.
6,483,308 B1    11/2002   Ma et al.
6,559,642 B2    5/2003    King

OTHER PUBLICATIONS

Pruessman et al. "SENSE: Sensitivity Encoding for Fast MRI", Magnetic Resonance in Medicine, vol. 42, pp. 952-962, 1999.*
Weiger et al. "Specific Coil Design for SENSE: A Six-Element Cardiac Array", Magnetic Resonance in Medicine, vol. 45, pp. 495-504, 2001.*
Madore et al. "SMASH vs SENSE", Proc. Intl. Soc. Magnetic Resonance Medicine, vol. 8, 2000.*

* cited by examiner

Primary Examiner—Bhavesh M Mehta
Assistant Examiner—Christopher Lavin
(74) Attorney, Agent, or Firm—Carl B. Horton, Esq.; Armstrong Teasdale LLP

(57) ABSTRACT

For a purpose of improving homogeneity of an image obtained in a self-calibration by a parallel imaging method generally referred to as SENSE (SENSitivity Encoding), sensitivity factors $S_n(p)$ are calculated using an additive image $A_b = \Sigma |C_n|$ of complex images $C_n$ obtained by conducting a calibration scan of an entire FOV for phased array coils Coil_n ($n=1$–N, $N \geq 2$) (Steps V2, V3). Moreover, sensitivity maps $S_n$ are generated by conducting curve fitting by the method of least squares weighted by the square of a pixel value $A_b(p)$ of the absolute value additive image $A_b$ (Step V4).

15 Claims, 5 Drawing Sheets

COIL SENSITIVITY MAP GENERATING METHOD, PARALLEL IMAGING METHOD, AND MRI APPARATUS

CROSS REFERENCE TO RELATED APPLICATIONS

This application claims the benefit of Japanese Application No. 2002-166994 filed Jun. 7, 2002.

BACKGROUND OF THE INVENTION

The present invention relates to a coil sensitivity map generating method, parallel imaging method, and MRI (magnetic resonance imaging) apparatus, and more particularly to a coil sensitivity map generating method, parallel imaging method, and MRI apparatus that can improve homogeneity of an image obtained in a self-calibration by a parallel imaging method generally referred to as SENSE (SENSitivity Encoding).

Conventional techniques relating to SENSE are described in, for example, the following literature:
(1) Pruessmann, K. P., Weiger, M., Scheidegger, M. B., and Boesiger P., Magn. Reson. Med., 42, 952 (1999); and
(2) P. B. Roemer, W. A. Edelstein, C. E. Hayes, S. P. Souza, and O. M. Mueller, Magn. Reson. Med., 16, 192–225 (1990).

FIG. 5 is a flow chart showing an operation of parallel imaging processing in a conventional MRI apparatus.

At Step J1, a calibration scan is conducted for an entire FOV (field of view) using phased array coils Coil_n (n=1–N, N≧2) to obtain respective complex images $C_n$ for the phased array coils Coil_n.

At Step J2, a square image $C_n^2$ of each complex image $C_n$ is produced, and an additive square root image $A_s=\text{sqrt}\{\Sigma C_n^2\}$ of the square images $C_n^2$ is produced. "Sqrt{ }" is a function for obtaining a square root.

At Step J3, a sensitivity factor $S_n(p)'$ at a pixel p in a phased array coil Coil_n is calculated by the following equation:

$$S_n(p)'=C_n(p)/A_s(p),$$

where a pixel value of a pixel p in the complex image $C_n$ is represented as $C_n(p)$, and a pixel value of a pixel p in the additive square root image $A_s$ is represented as $A_s(p)$.

At Step J4, sensitivity map $S_n'$ are generated based on the sensitivity factors $S_n(p)'$.

At Step J5, a scan is conducted with a smaller FOV using the phased array coils Coil_1–Coil_N to obtain respective complex images A1–AN of the phased array coils Coil_1–Coil_N.

At Step J6, a complex image for the entire FOV is produced from the sensitivity maps $S_n'$ and the complex images A1–AN.

At Step J7, Steps J5 and J6 are repeated for a desired number of images.

Since the conventional parallel imaging processing shown in FIG. 5 generates the sensitivity maps $S_n'$ using only the phased array coils Coil_n ("self-calibration"), there is no need to obtain a separate calibration image using a body coil, thus offering an advantage of a simplified operation.

However, while the sensitivity factors $S_n(p)'$ calculated using the additive square root image $A_s=\text{sqrt}\{\Sigma C_n^2\}$ of the square images $C_n^2$ of the complex images $C_n$ offer an excellent S/N ratio, they are not optimal in view of image homogeneity. That is, the image obtained by the conventional self-calibration suffers from a disadvantage of large inhomogeneity.

SUMMARY OF THE INVENTION

It is therefore an object of the present invention to provide a coil sensitivity map generating method, parallel imaging method, and MRI apparatus that can improve homogeneity of an image obtained in a self-calibration.

In accordance with its first aspect, the present invention provides a coil sensitivity map generating method characterized in comprising: when a pixel value of a pixel p in a complex image $C_n$ obtained by conducting a calibration scan of an entire FOV for each of phased array coils Coil_n (n=1–N, N≧2) is represented as $C_n(p)$, and a pixel value of a pixel p in an additive image $A_b=\Sigma|C_n|$ obtained by adding absolute value images $|C_n|$ produced from said complex images $C_n$ is represented as $A_b(p)$, calculating a sensitivity factor $S_n(p)$ at a pixel p in a phased array coil Coil_n by:

$$S_n(p)=C_n(p)/A_b(p);$$

and generating respective sensitivity maps $S_n$ of the phased array coils Coil_n based on said sensitivity factors $S_n(p)$.

The coil sensitivity map generating method of the first aspect calculates the sensitivity factors $S_n(p)$ using an additive image $A_b=\Sigma|C_n|$ of the absolute value images $|C_n|$ of the complex images $C_n$, and therefore, image homogeneity is improved as compared with using the additive square root image $A_s=\text{sqrt}\{\Sigma C_n^2\}$ of the square images $C_n^2$ of the complex images $C_n$.

In accordance with its second aspect, the present invention provides the coil sensitivity map generating method having the aforementioned configuration, characterized in comprising: generating the sensitivity map $S_n$ by conducting curve fitting on said sensitivity factors $S_n(p)$.

The sensitivity factors $S_n(p)$ calculated using the additive image $A_b=\Sigma|C_n|$ of the absolute value images $|C_n|$ of the complex images $C_n$ provide a poorer S/N ratio than that using the additive square root image $A_s=\text{sqrt}\{\Sigma C_n^2\}$ of the square images $C_n^2$ of the complex images $C_n$.

However, the coil sensitivity map generating method of the second aspect generates the sensitivity map $S_n$ by conducting curve fitting on the sensitivity factors $S_n(p)$, and therefore, noise influence can be suppressed to improve the S/N ratio.

In accordance with its third aspect, the present invention provides the coil sensitivity map generating method having the aforementioned configuration, characterized in comprising: conducting two-dimensional curve fitting using a two-dimensional polynomial.

The coil sensitivity map generating method of the third aspect conducts two-dimensional curve fitting using a two-dimensional polynomial, and therefore, a sensitivity map having a smooth surface can be generated.

In accordance with its fourth aspect, the present invention provides the coil sensitivity map generating method having the aforementioned configuration, characterized in comprising: conducting the two-dimensional curve fitting using a two-dimensional quadratic polynomial $a \cdot x^2 + b \cdot y^2 + c \cdot x + d \cdot y + e \cdot x \cdot y + f$.

The coil sensitivity map generating method of the fourth aspect conducts the two-dimensional curve fitting using a two-dimensional quadratic polynomial, and therefore, a sensitivity map having a smooth surface can be generated.

In accordance with its fifth aspect, the present invention provides the coil sensitivity map generating method having the aforementioned configuration, characterized in comprising: conducting the curve fitting by the method of least squares weighted by the square of a pixel value $A_b(p)$ of said absolute value additive image $A_b$.

The value of the square of a pixel value $A_b(p)$ of the absolute value additive image $A_b$ is large in a signal portion and is small in a noise portion.

The coil sensitivity map generating method of the fifth aspect therefore conducts the curve fitting by the method of least squares weighted by square of a pixel value $A_b(p)$ of the absolute value additive image $A_b$. Thus, noise influence can be further suppressed to further improve the S/N ratio.

In accordance with its sixth aspect, the present invention provides a parallel imaging method characterized in comprising: obtaining respective complex images $C_n$ by conducting a calibration scan of an entire FOV for phased array coils Coil_n (n=1–N, N≧2); producing an absolute value image $|C_n|$ from each said complex image $C_n$; producing an additive image $A_b = \Sigma |C_n|$ by adding said absolute value images $|C_n|$; calculating a sensitivity factor $S_n(p)$ at a pixel p in a phased array coil Coil_n by:

$$S_n(p) = C_n(p)/A_b(p),$$

where a pixel value of a pixel p in said complex image $C_n$ is represented as $C_n(p)$, and a pixel value of a pixel p in said additive image $A_b$ is represented as $A_b(p)$; generating respective sensitivity maps $S_n$ of the phased array coils Coil_n based on said sensitivity factors $S_n(p)$; obtaining respective complex images $A_n$ by conducting a scan with a smaller FOV for the phased array coils Coil_n; and producing a complex image of the entire FOV from said sensitivity maps $S_n$ and said complex images $A_n$.

The parallel imaging method of the sixth aspect calculates the sensitivity factors $S_n(p)$ using an additive image $A_b = \Sigma |C_n|$ of the absolute value images $|C_n|$ of the complex images $C_n$, and therefore, image homogeneity is improved as compared with using the additive square root image $A_s = \mathrm{sqrt}\{\Sigma C_n^2\}$ of the square images $C_n^2$ of the complex images $C_n$.

In accordance with its seventh aspect, the present invention provides the parallel imaging method having the aforementioned configuration, characterized in comprising: generating the sensitivity map $S_n$ by conducting curve fitting on said sensitivity factors $S_n(p)$.

The sensitivity factors $S_n(p)$ calculated using the additive image $A_b = \Sigma |C_n|$ of the absolute value images $|C_n|$ of the complex images $C_n$ provide a poorer S/N ratio than that using the additive square root image $A_s = \mathrm{sqrt}\{\Sigma C_n^2\}$ of the square images $C_n^2$ of the complex images $C_n$.

However, the parallel imaging method of the seventh aspect generates the sensitivity map $S_n$ by conducting curve fitting on the sensitivity factors $S_n(p)$, and therefore, noise influence can be suppressed to improve the S/N ratio.

In accordance with its eighth aspect, the present invention provides the parallel imaging method having the aforementioned configuration, characterized in comprising: conducting two-dimensional curve fitting using a two-dimensional polynomial.

The parallel imaging method of the eighth aspect conducts two-dimensional curve fitting using a two-dimensional polynomial, and therefore, a sensitivity map having a smooth surface can be generated.

In accordance with its ninth aspect, the present invention provides the parallel imaging method having the aforementioned configuration, characterized in comprising: conducting the two-dimensional curve fitting using a two-dimensional quadratic polynomial $a \cdot x^2 + b \cdot y^2 + c \cdot x + d \cdot y + e \cdot x \cdot y + f$.

The parallel imaging method of the ninth aspect conducts two-dimensional curve fitting using a two-dimensional quadratic polynomial, and therefore, a sensitivity map having a smooth surface can be generated.

In accordance with its tenth aspect, the present invention provides the parallel imaging method having the aforementioned configuration, characterized in comprising: conducting the curve fitting by the method of least squares weighted by the square of said pixel value $A_b(p)$.

The value of the square of a pixel value $A_b(p)$ of the absolute value additive image $A_b$ is large in a signal portion and is small in a noise portion.

The parallel imaging method of the tenth aspect therefore conducts the curve fitting by the method of least squares weighted by the square of a pixel value $A_b(p)$ of the absolute value additive image $A_b$. Thus, noise influence can be further suppressed to further improve the S/N ratio.

In accordance with its eleventh aspect, the present invention provides an MRI apparatus characterized in comprising: a transmitting coil for transmitting an RF pulse; a gradient coil for applying a gradient magnetic field; phased array coils Coil_n (n=1–N, N≧2) for receiving an MR signal; calibration scan means for driving said transmitting coil, gradient coil, and phased array coils Coil_n to conduct a calibration scan of an entire FOV and obtain respective complex images $C_n$ for the phased array coils Coil_n; additive image producing means for producing an absolute value image $|C_n|$ from each said complex image $C_n$ and producing an additive image $A_b = \Sigma |C_n|$ by adding said absolute value images $|C_n|$; sensitivity factor calculating means for calculating a sensitivity factor $S_n(p)$ at a pixel p in a phased array coil Coil_n by:

$$S_n(p) = C_n(p)/A_b(p),$$

where a pixel value of a pixel p in said complex image $C_n$ is represented as $C_n(p)$, and a pixel value of a pixel p in said additive image $A_b$ is represented as $A_b(p)$; and sensitivity map generating means for generating respective sensitivity maps $S_n$ of the phased array coils Coil_n based on said sensitivity factors $S_n(p)$.

The MRI apparatus of the eleventh aspect can suitably implement the coil sensitivity map generating method as described regarding the first aspect.

In accordance with its twelfth aspect, the present invention provides the MRI apparatus having the aforementioned configuration, characterized in that: said sensitivity map generating means generates the sensitivity map $S_n$ by conducting curve fitting on said sensitivity factors $S_n(p)$.

The MRI apparatus of the twelfth aspect can suitably implement the coil sensitivity map generating method as described regarding the second aspect.

In accordance with its thirteenth aspect, the present invention provides the MRI apparatus having the aforementioned configuration, characterized in that: said sensitivity map generating means conducts two-dimensional curve fitting using a two-dimensional polynomial.

The MRI apparatus of the thirteenth aspect can suitably implement the coil sensitivity map generating method as described regarding the third aspect.

In accordance with its fourteenth aspect, the present invention provides the MRI apparatus having the aforementioned configuration, characterized in that: said sensitivity map generating means conducts the two-dimensional curve fitting using a two-dimensional quadratic polynomial $a \cdot x^2 + b \cdot y^2 + c \cdot x + d \cdot y + e \cdot x \cdot y + f$.

The MRI apparatus of the fourteenth aspect can suitably implement the coil sensitivity map generating method as described regarding the fourth aspect.

In accordance with its fifteenth aspect, the present invention provides the MRI apparatus having the aforementioned configuration, characterized in that: said sensitivity map generating means conducts the curve fitting by the method of least squares weighted by the square of said pixel value $A_b(p)$.

The MRI apparatus of the fifteenth aspect can suitably implement the coil sensitivity map generating method as described regarding the fifth aspect.

In accordance with its sixteenth aspect, the present invention provides an MRI apparatus characterized in comprising: a transmitting coil for transmitting an RF pulse; a gradient coil for applying a gradient magnetic field; phased array coils Coil_n (n=1–N, N≧2) for receiving an MR signal; calibration scan means for driving said transmitting coil, gradient coil, and phased array coils Coil_n to conduct a calibration scan of an entire FOV and obtain respective complex images $C_n$ for the phased array coils Coil_n; absolute value additive image producing means for producing an absolute value image $|C_n|$ from each said complex image $C_n$ and producing an additive image $A_b = \Sigma |C_n|$ by adding said absolute value images $|C_n|$; sensitivity factor calculating means for calculating a sensitivity factor $S_n(p)$ at a pixel p in a phased array coil Coil_n by:

$$S_n(p) = C_n(p)/A_b(p),$$

where a pixel value of a pixel p in said complex image $C_n$ is represented as $C_n(p)$, and a pixel value of a pixel p in said additive image $A_b$ is represented as $A_b(p)$; sensitivity map generating means for generating respective sensitivity maps $S_n$ of the phased array coils Coil_n based on said sensitivity factors $S_n(p)$; parallel scan means for driving said transmitting coil, gradient coil, and phased array coils Coil_n to conduct a scan with a smaller FOV and obtain respective complex images $A_n$; and entire FOV image producing means for producing a complex image of the entire FOV from said sensitivity maps $S_n$ and said complex images $A_n$.

The MRI apparatus of the sixteenth aspect can suitably implement the parallel imaging method as described regarding the sixth aspect.

In accordance with its seventeenth aspect, the present invention provides the MRI apparatus having the aforementioned configuration, characterized in that: said sensitivity map generating means generates the sensitivity map $S_n$ by conducting curve fitting on said sensitivity factors $S_n(p)$.

The MRI apparatus of the seventeenth aspect can suitably implement the parallel imaging method as described regarding the seventh aspect.

In accordance with its eighteenth aspect, the present invention provides the MRI apparatus having the aforementioned configuration, characterized in that: said sensitivity map generating means conducts two-dimensional curve fitting using a two-dimensional polynomial.

The MRI apparatus of the eighteenth aspect can suitably implement the parallel imaging method as described regarding the eighth aspect.

In accordance with its nineteenth aspect, the present invention provides the MRI apparatus having the aforementioned configuration, characterized in that: said sensitivity map generating means conducts the two-dimensional curve fitting using a two-dimensional quadratic polynomial $a \cdot x^2 + b \cdot y^2 + c \cdot x + d \cdot y + e \cdot x \cdot y + f$.

The MRI apparatus of the nineteenth aspect can suitably implement the parallel imaging method as described regarding the ninth aspect.

In accordance with its twentieth aspect, the present invention provides the MRI apparatus having the aforementioned configuration, characterized in that: said sensitivity map generating means conducts the curve fitting by the method of least squares weighted by the square of said pixel value $A_b(p)$.

The MRI apparatus of the twentieth aspect can suitably implement the parallel imaging method as described regarding the tenth aspect.

According to the coil sensitivity map generating method, parallel imaging method, and MRI apparatus of the present invention, homogeneity of an image obtained in a self-calibration by a parallel imaging method generally referred to as SENSE can be improved.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to embodiments shown in the accompanying drawings.

Figure 1:
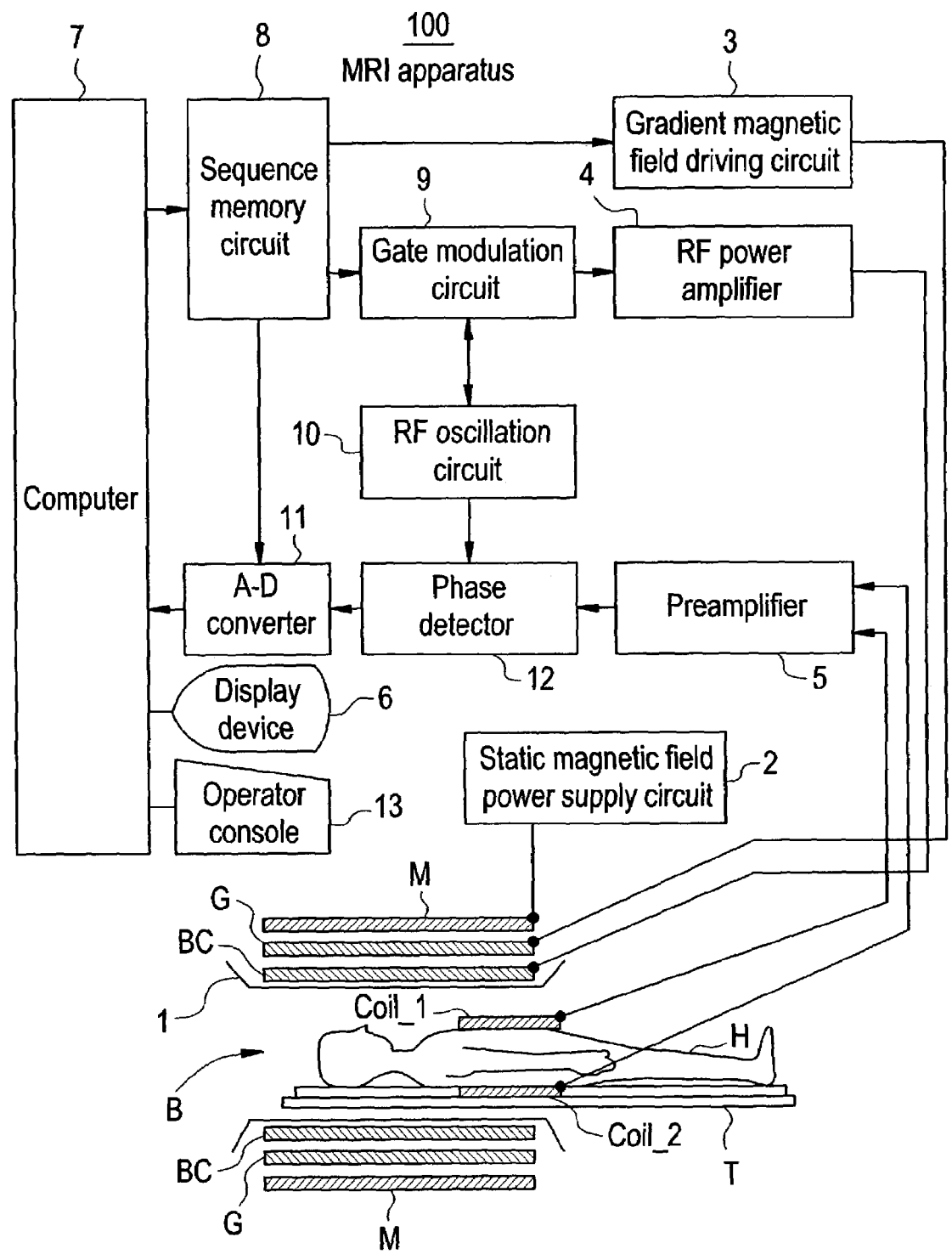
FIG. 1 is a block diagram of an MRI apparatus in accordance with one embodiment of the present invention.

FIG. 1 is a block diagram showing an MRI apparatus in accordance with one embodiment of the present invention.

In the MRI apparatus 100, a magnet assembly 1 has a bore B for inserting therein a subject H rested on a table T, and comprises, surrounding the bore B, a static magnetic field coil M for generating a constant static magnetic field, a gradient magnetic field coil G for generating gradient magnetic fields along X-, Y- and Z-axes, and a body coil BC for transmitting an RF pulse.

Over the trunk of the subject H, phased array coils Coil_1 and Coil_2 are disposed for receiving an MR signal.

The static magnetic field coil M is connected to a static magnetic field power supply circuit 2; the gradient magnetic field coil G is connected to a gradient magnetic field driving circuit 3; the body coil BC is connected to an RF power amplifier 4; and the phased array coils Coil_1 and Coil_2 are connected to a preamplifier 5.

A permanent magnet may be used in place of the static magnetic field coil M.

A sequence memory circuit 8 operates the gradient magnetic field driving circuit 3 based on a stored pulse sequence in response to instructions from a computer 7 to thereby generate a gradient magnetic field from the gradient magnetic field coil G; and it also operates a gate modulation circuit 9 to modulate a carrier output signal from an RF oscillation circuit 10 into a pulsed signal of predefined timing and envelope shape, which pulsed signal is power-amplified in the RF power amplifier 4, and then supplied to the body coil BC to transmit an RF pulse for selectively exciting an imaged region in the subject H.

The preamplifier 5 amplifies an MR signal from the subject H received at the phased array coils Coil_1 and Coil_2, and inputs the signal to a phase detector 12. The phase detector 12 phase-detects the MR signal from the preamplifier 5 employing the carrier output signal from the RF oscillation circuit 10 as a reference signal, and supplies the phase-detected signal to an A-D converter 11. The A-D converter 11 converts the phase-detected analog signal into digital data, and inputs it to the computer 7.

The computer 7 accumulates the input digital data, and conducts coil sensitivity map generation for the phased array coils Coil_1 and Coil_2. It also executes image reconstruction processing to produce an image. Moreover, the computer 7 is responsible for overall control, such as receiving information supplied from an operator console 13.

A display device displays the image and messages.

Figure 2:
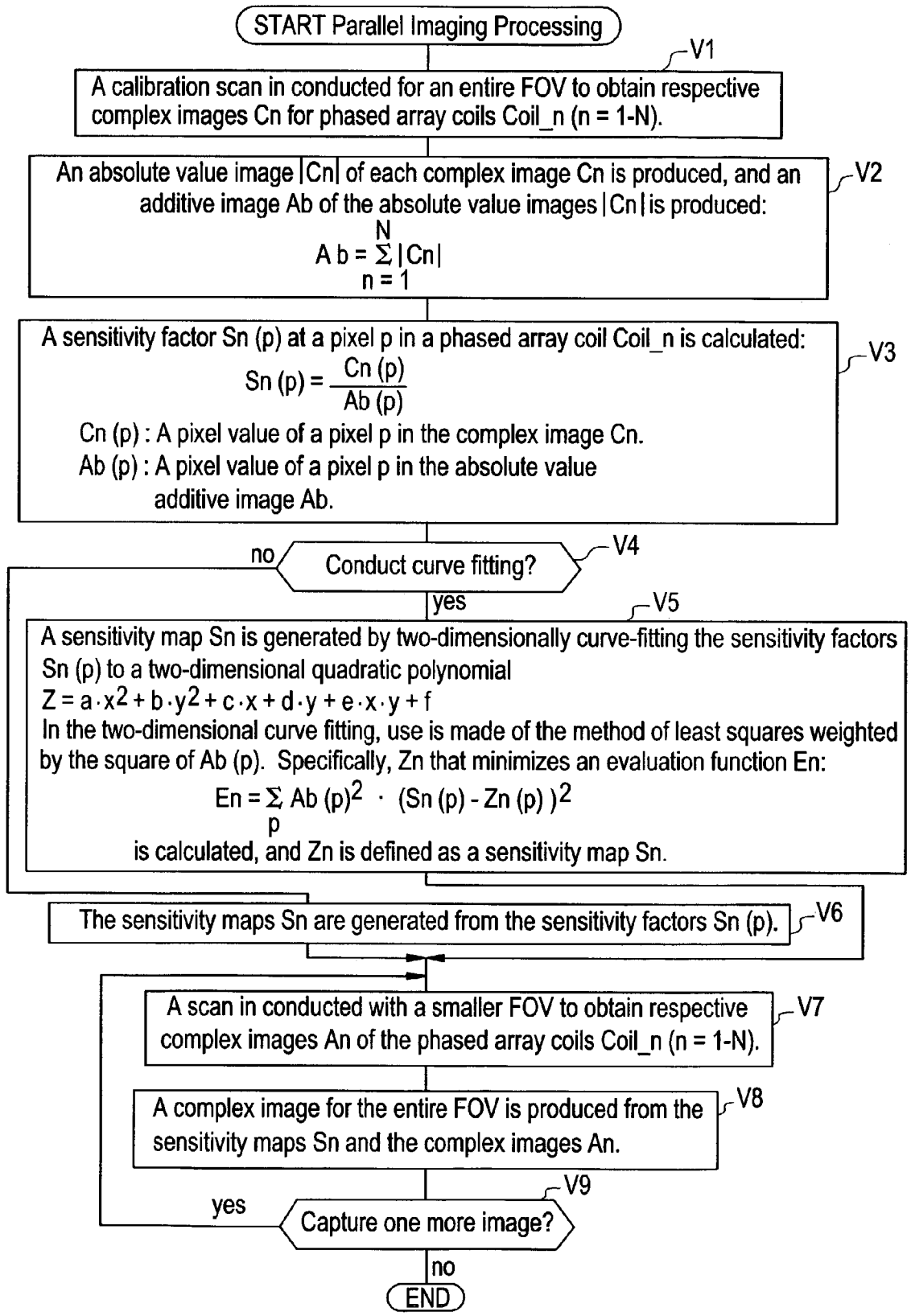
FIG. 2 is a flow chart showing an operation of parallel imaging processing in accordance with one embodiment of the present invention.

FIG. 2 is a flow chart showing an operation of parallel imaging processing at the MRI apparatus 100.

At Step V1, a calibration scan is conducted for an entire FOV using a phased array coils Coil_n (n=1, 2) to obtain respective complex images $C_n$ for the phased array coils Coil_n.

At Step V2, an absolute value image $|C_n|$ of each complex image $C_n$ is produced, and an additive image $A_b=\Sigma|C_n|$ of the absolute value images $|C_n|$ is produced.

At Step V3, a sensitivity factor $S_n(p)$ at a pixel p in a phased array coil Coil_n is calculated by the following equation:

$$S_n(p)=C_n(p)/A_b(p),$$

where a pixel value of a pixel p in the complex image $C_n$ is represented as $C_n(p)$, and a pixel value of a pixel p in the absolute value additive image $A_b$ is represented as $A_b(p)$.

At Step V4, if the operator directs curve fitting to be conducted, the process goes to Step V5; and if the operator directs curve fitting not to be conducted, the process goes to Step V6.

At Step V5, a sensitivity map $S_n$ is generated by two-dimensionally curve-fitting the sensitivity factors $S_n(p)$ to a two-dimensional quadratic polynomial $Z=a \cdot x^2+b \cdot y^2+c \cdot x+d \cdot y+e \cdot x \cdot y+f$. This is done by using the method of least squares weighted by the square of a pixel value $A_b(p)$ of the absolute value additive image $A_b$. Specifically, $Z_n$ that minimizes an evaluation function $E_n$:

$$E_n=\Sigma A_b(p)^2 \cdot (S_n(p)-Z_n(p))^2$$

is calculated, and $Z_n$ is defined as a sensitivity map $S_n$. Then, the process goes to Step V7.

At Step V6, sensitivity maps $S_n$ are generated based on the sensitivity factors $S_n(p)$. The process then goes to Step V7.

At Step V7, a scan is conducted with a smaller FOV using the phased array coils Coil_1–Coil_N to obtain respective complex images A1–AN of the phased array coils Coil_1–Coil_N.

At Step V8, a complex image for the entire FOV is produced from the sensitivity maps $S_n$ and the complex images A1–AN.

At Step V9, Steps V7 and V8 are repeated for a desired number of images.

Figure 3:
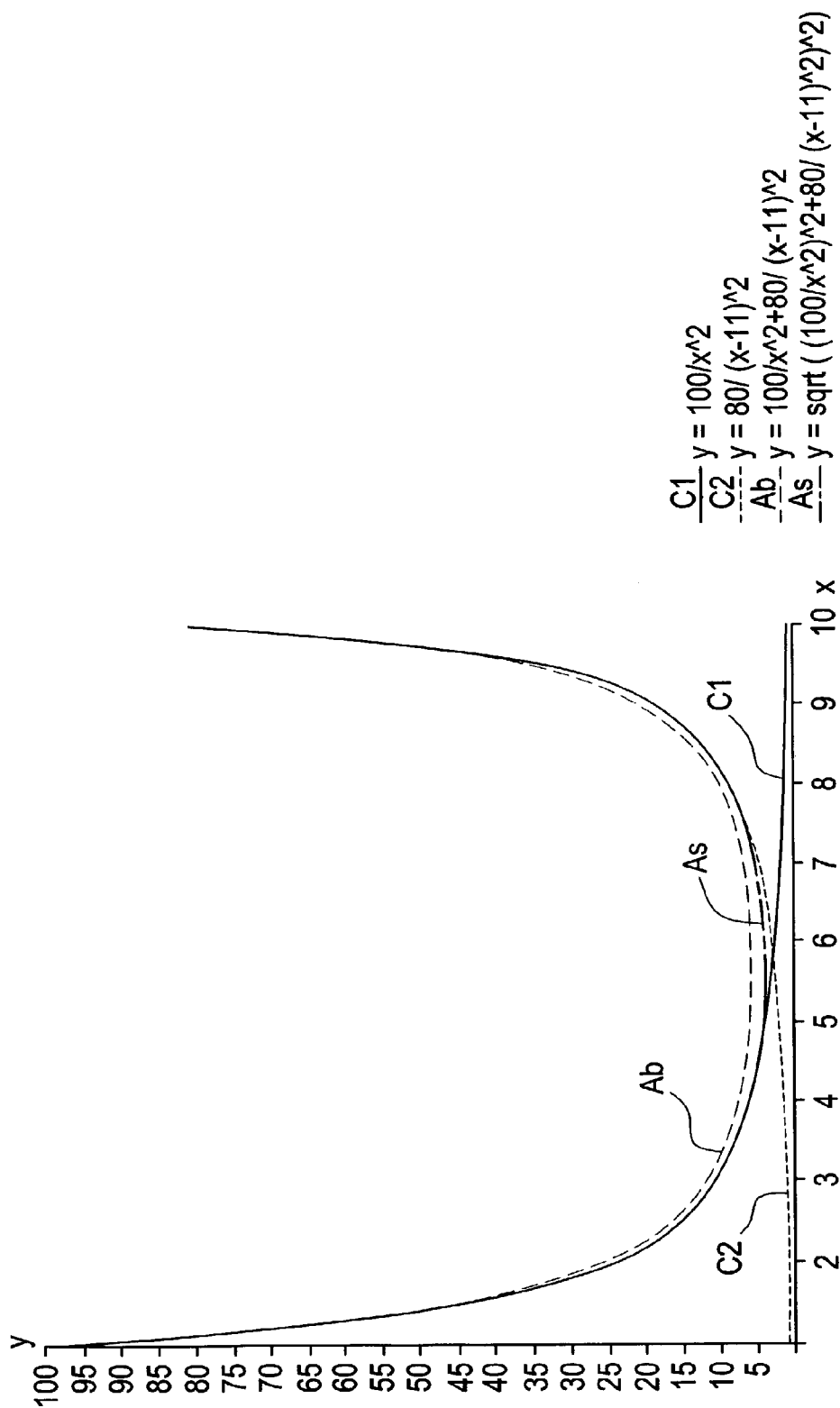
FIG. 3 is a conceptual explanatory diagram showing the difference between an absolute value additive image $A_b$ in accordance with the present invention and a conventional additive square root image $A_s$.

FIG. 3 is a conceptual explanatory diagram showing the difference between an absolute value additive image $A_b$ in accordance with the present invention and a conventional additive square root image $A_s$.

The absolute value additive image $A_b$ in accordance with the present invention has higher homogeneity than the conventional additive square root image $A_s$.

Figure 4:
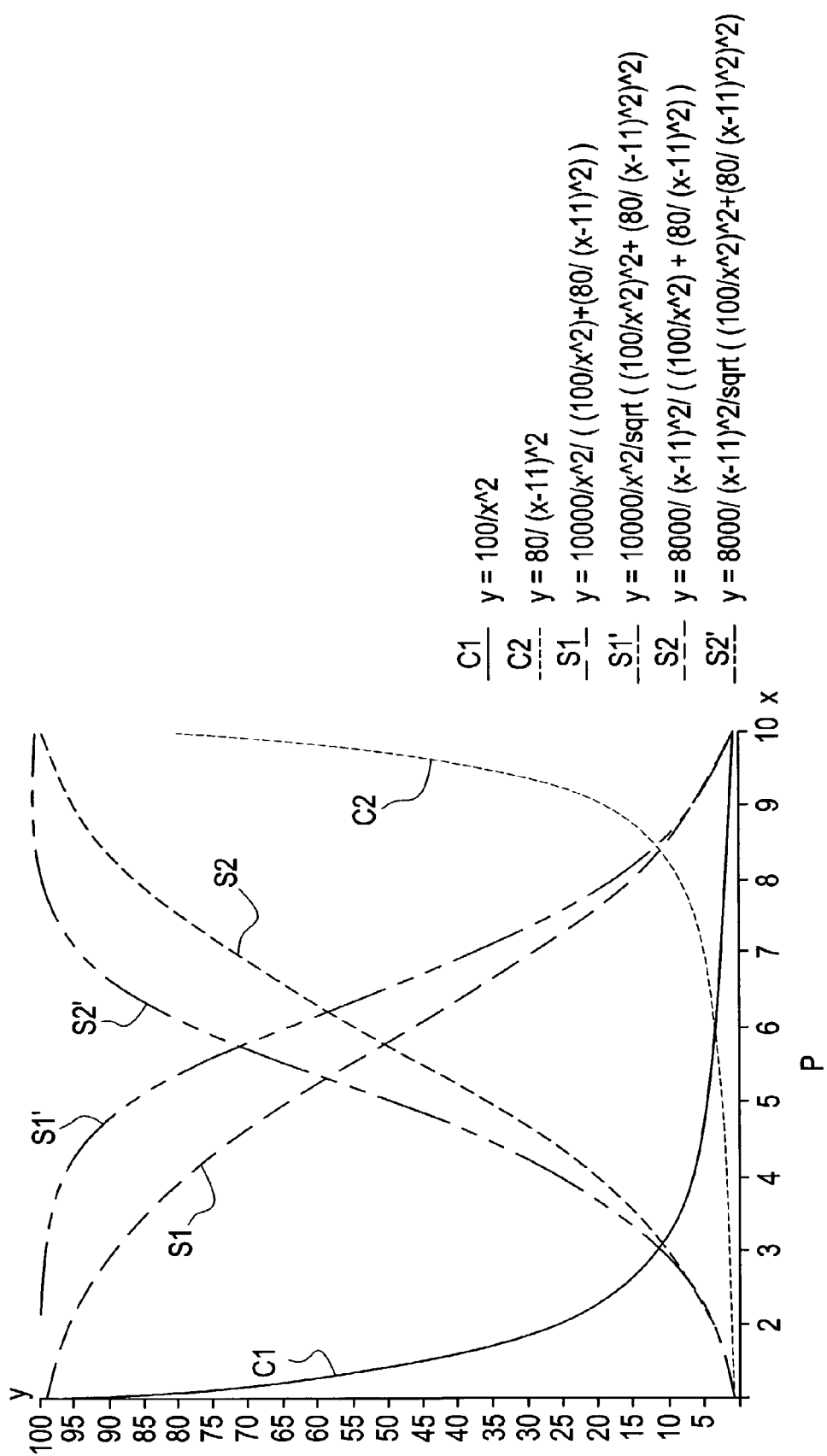
FIG. 4 is a conceptual explanatory diagram showing the difference between sensitivity maps S1 and S2 in accordance with the present invention and conventional sensitivity maps S1' and S2'.
Figure 5:
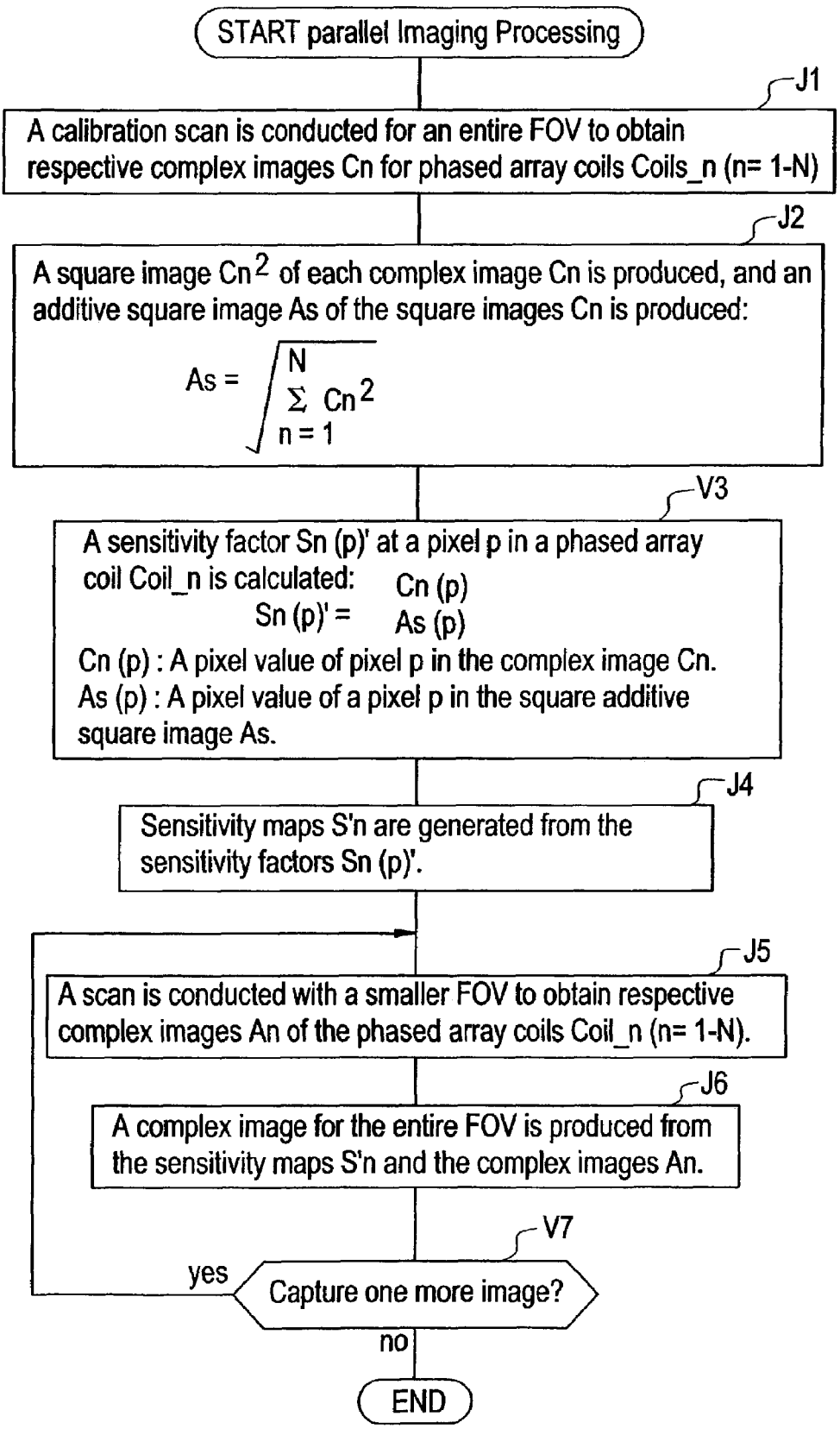
FIG. 5 is a flow chart showing an exemplary operation of conventional parallel imaging processing.

FIG. 4 is a conceptual explanatory diagram showing the difference between sensitivity maps S1 and S2 in accordance with the present invention and conventional sensitivity maps S1' and S2'.

The sensitivity maps S1 and S2 in accordance with the present invention change more gradually than the conventional sensitivity maps S1' and S2'.

According to the MRI apparatus 100, the following effects are obtained:

(1) Since the sensitivity factors $S_n(p)$ are calculated using an absolute value additive image $A_b=\Sigma|C_n|$, image homogeneity is improved as compared with using an additive square root image $A_s=\text{sqrt}\{\Sigma C_n^2\}$.

(2) Since two-dimensional curve fitting is conducted using a two-dimensional quadratic polynomial, a sensitivity map having a smooth surface can be generated, and noise influence can be suppressed to improve the S/N ratio. Moreover, at that time, the curve fitting is conducted by the method of least squares weighted by the square of a pixel value $A_b(p)$ of the absolute value additive image $A_b$, noise influence can be further suppressed to further improve the S/N ratio.

Many widely different embodiments of the invention may be configured without departing from the spirit and the scope of the present invention. It should be understood that the present invention is not limited to the specific embodiments described in the specification, except as defined in the appended claims.

The invention claimed is:

1. A coil sensitivity map generating method comprising: when a pixel value of a pixel p in a complex image $C_n$ obtained by conducting a calibration scan of an entire FOV for each of phased array coils Coil_n (n=1–N, N≧2) is represented as $C_n(p)$, and a pixel value of a pixel p in an additive image $A_b=\Sigma|C_n|$ obtained by adding absolute value images $|C_n|$ produced from said complex images $C_n$ is represented as $A_b(p)$, calculating a sensitivity factor $S_n(p)$ at a pixel p in a phased array coil Coil_n by:

$$S_n(p)=C_n(p)/A_b(p);$$

and generating respective sensitivity maps $S_n$ of the phased array coils Coil_n based on said sensitivity factors $S_n(p)$.

2. The coil sensitivity map generating method of claim 1, comprising: generating the sensitivity map $S_n$ by conducting curve fitting on said sensitivity factors $S_n(p)$.

3. The coil sensitivity map generating method of claim 2, comprising: conducting two-dimensional curve fitting using a two-dimensional polynomial.

4. The coil sensitivity map generating method of claim 3, comprising: conducting the two-dimensional curve fitting using a two-dimensional quadratic polynomial $a \cdot x^2 + b \cdot y^2 + c \cdot x + d \cdot y + e \cdot x \cdot y + f$.

5. The coil sensitivity map generating method of claim 2, comprising: conducting the curve fitting by the method of least squares weighted by the square of a pixel value $A_b(p)$ of said absolute value additive image $A_b$.

6. A parallel imaging method comprising: obtaining respective complex images $C_n$ by conducting a calibration scan of an entire FOV for phased array coils Coil_n (n=1–N, N≧2); producing an absolute value image $|C_n|$ from each said complex image $C_n$; producing an additive image $A_b = \Sigma |C_n|$ by adding said absolute value images $|C_n|$; calculating a sensitivity factor $S_n(p)$ at a pixel p in a phased array coil Coil_n by:

$$S_n(p) = C_n(p)/A_b(p),$$

where a pixel value of a pixel p in said complex image $C_n$ is represented as $C_n(p)$, and a pixel value of a pixel p in said additive image $A_b$ is represented as $A_b(p)$; generating respective sensitivity maps $S_n$ of the phased array coils Coil_n based on said sensitivity factors $S_n(p)$; obtaining respective complex images $A_n$ by conducting a scan with a smaller FOV for the phased array coils Coil_n; and producing a complex image of the entire FOV from said sensitivity maps $S_n$ and said complex images $A_n$.

7. The parallel imaging method of claim 6, comprising: generating the sensitivity map $S_n$ by conducting curve fitting on said sensitivity factors $S_n(p)$.

8. The parallel imaging method of claim 7, comprising: conducting two-dimensional curve fitting using a two-dimensional polynomial.

9. The parallel imaging method of claim 8, comprising: conducting the two-dimensional curve fitting using a two-dimensional quadratic polynomial $a \cdot x^2 + b \cdot y^2 + c \cdot x + d \cdot y + e \cdot x \cdot y + f$.

10. The parallel imaging method of claim 7, comprising: conducting the curve fitting by the method of least squares weighted by the square of said pixel value $A_b(p)$.

11. An MRI apparatus comprising: a transmitting coil for transmitting an RF pulse; a gradient coil for applying a gradient magnetic field; phased array coils Coil_n (n=1–N, N≧2) for receiving an MR signal; calibration scan means for driving said transmitting coil, gradient coil, and phased array coils Coil_n to conduct a calibration scan of an entire FOV and obtain respective complex images $C_n$ for the phased array coils Coil_n; absolute value additive image producing means for producing an absolute value image $|C_n|$ from each said complex image $C_n$ and producing an additive image $A_b = \Sigma |C_n|$ by adding said absolute value images $|C_n|$; sensitivity factor calculating means for calculating a sensitivity factor $S_n(p)$ at a pixel p in a phased array coil Coil_n by:

$$S_n(p) = C_n(p)/A_b(p),$$

where a pixel value of a pixel p in said complex image $C_n$ is represented as $C_n(p)$, and a pixel value of a pixel p in said additive image $A_b$ is represented as $A_b(p)$; sensitivity map generating means for generating respective sensitivity maps $S_n$ of the phased array coils Coil_n based on said sensitivity factors $S_n(p)$; parallel scan means for driving said transmitting coil, gradient coil, and phased array coils Coil_n to conduct a scan with a smaller FOV and obtain respective complex images $A_n$; and entire FOV image producing means for producing a complex image of the entire FOV from said sensitivity maps $S_n$ and said complex images $A_n$.

12. The MRI apparatus of claim 11, wherein said sensitivity map generating means generates the sensitivity map $S_n$ by conducting curve fitting on said sensitivity factors $S_n(p)$.

13. The MRI apparatus of claim 12, wherein said sensitivity map generating means conducts two-dimensional curve fitting using a two-dimensional polynomial.

14. The MRI apparatus of claim 13, wherein said sensitivity map generating means conducts the two-dimensional curve fitting using a two-dimensional quadratic polynomial $a \cdot x^2 + b \cdot y^2 + c \cdot x + d \cdot y + e \cdot x \cdot y + f$.

15. The MRI apparatus of claim 12, wherein said sensitivity map generating means conducts the curve fitting by the method of least squares weighted by the square of said pixel value $A_b(p)$.

* * * * *